(12) United States Patent
Zhang et al.

(10) Patent No.: US 7,808,596 B2
(45) Date of Patent: Oct. 5, 2010

(54) TFT LCD ARRAY SUBSTRATE AND THE MANUFACTURING METHOD THEREOF

(75) Inventors: Mi Zhang, Beijing (CN); Wei Wang, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 11/942,140

(22) Filed: Nov. 19, 2007

(65) Prior Publication Data
US 2008/0117347 A1 May 22, 2008

(30) Foreign Application Priority Data
Nov. 17, 2006 (CN) .................... 2006 1 0145218

(51) Int. Cl.
*G02F 1/1343* (2006.01)
(52) U.S. Cl. ...................................... 349/143
(58) Field of Classification Search .................. 349/143
See application file for complete search history.

(56) References Cited

U.S. PATENT DOCUMENTS

| | | |
|---|---|---|
| 6,795,151 B2 | 9/2004 | Lee |
| 6,809,787 B1 | 10/2004 | Seo et al. |
| 7,092,049 B2 | 8/2006 | Kadotani et al. |
| 7,095,469 B2 | 8/2006 | Kim et al. |
| 7,173,680 B2 | 2/2007 | Seo et al. |
| 2004/0008312 A1* | 1/2004 | Yun et al. ................... 349/141 |
| 2006/0114397 A1 | 6/2006 | Mizusako et al. |
| 2007/0246707 A1 | 10/2007 | Deng |
| 2007/0272926 A1 | 11/2007 | Deng |
| 2007/0298554 A1 | 12/2007 | Long |
| 2008/0030639 A1 | 2/2008 | Qiu |
| 2008/0061295 A1 | 3/2008 | Wang |
| 2008/0100766 A1 | 5/2008 | Ming |
| 2008/0105873 A1 | 5/2008 | Wang |
| 2008/0105874 A1 | 5/2008 | Wang |
| 2008/0111136 A1 | 5/2008 | Qiu |
| 2008/0111934 A1 | 5/2008 | Wu |
| 2008/0123007 A1 | 5/2008 | Cui |
| 2008/0123030 A1 | 5/2008 | Song |
| 2008/0142802 A1 | 6/2008 | Qiu |
| 2008/0142819 A1 | 6/2008 | Liu |

(Continued)

FOREIGN PATENT DOCUMENTS

CN 1550858 A 12/2004

(Continued)

OTHER PUBLICATIONS

U.S. Appl. No. 12/104,575, filed Apr. 17, 2008.

*Primary Examiner*—Jerry T Rahll
(74) *Attorney, Agent, or Firm*—Hasse & Nesbitt LLC; Daniel F. Nesbitt

(57) ABSTRACT

Provided are a TFT LCD array substrate and manufacturing method thereof. The TFT LCD array substrate comprises a substrate, a gate line and a data line formed on the substrate and crossing each other so as to define a pixel area, a pixel electrode formed in the pixel area, a TFT formed in the pixel area, a common electrode formed on the substrate and extending parallel to the data line. The common electrode is not formed in the central portion of a pixel area, thus improving the aperture ratio.

12 Claims, 4 Drawing Sheets

U.S. PATENT DOCUMENTS

2008/0164470 A1 7/2008 Wang
2008/0166838 A1 7/2008 Long

FOREIGN PATENT DOCUMENTS

| | | |
|---|---|---|
| CN | 1567074 A | 1/2005 |
| JP | 03-198030 | 8/1991 |
| JP | 08-015711 A2 | 1/1996 |
| JP | 2006-276160 A | 10/2006 |
| KR | 2000-0047368 | 7/2000 |
| KR | 2001-0003061 | 1/2001 |

* cited by examiner

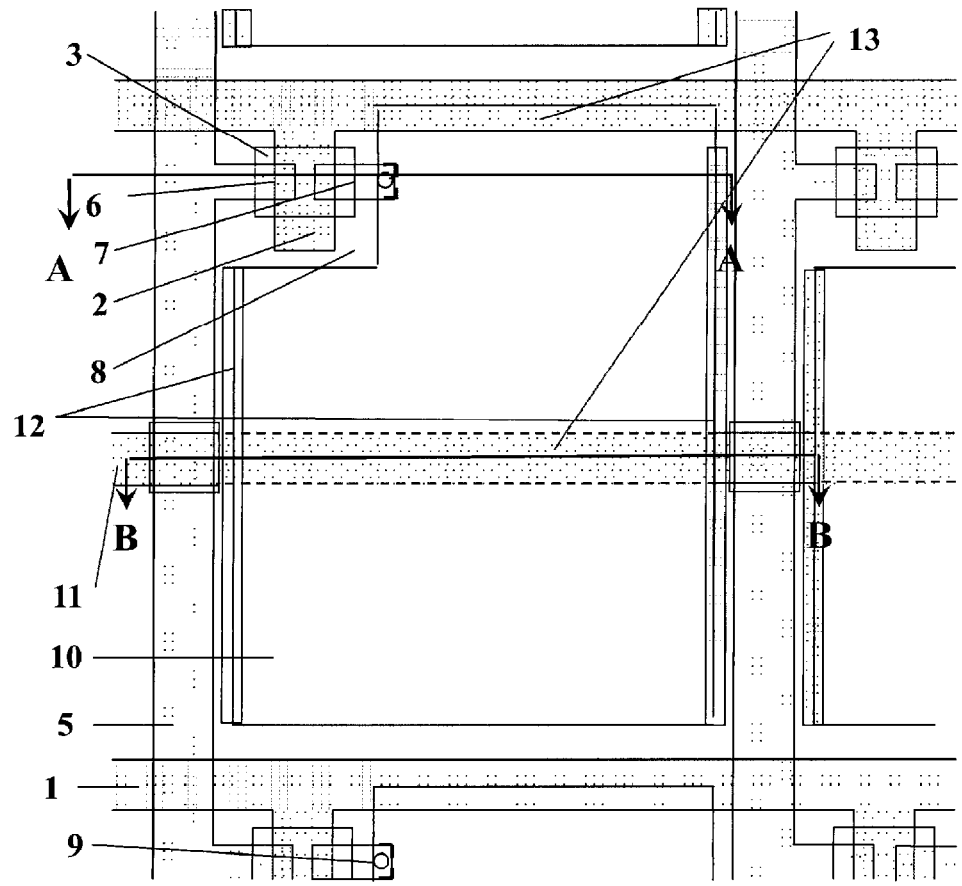
Figure 1A – Prior art
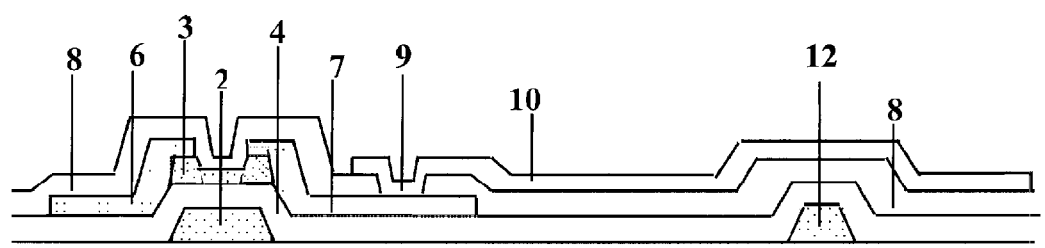
Figure 1B – Prior art

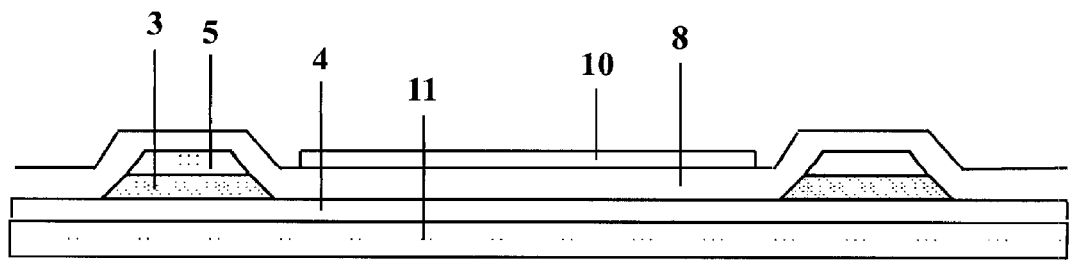
Figure 1C – Prior art
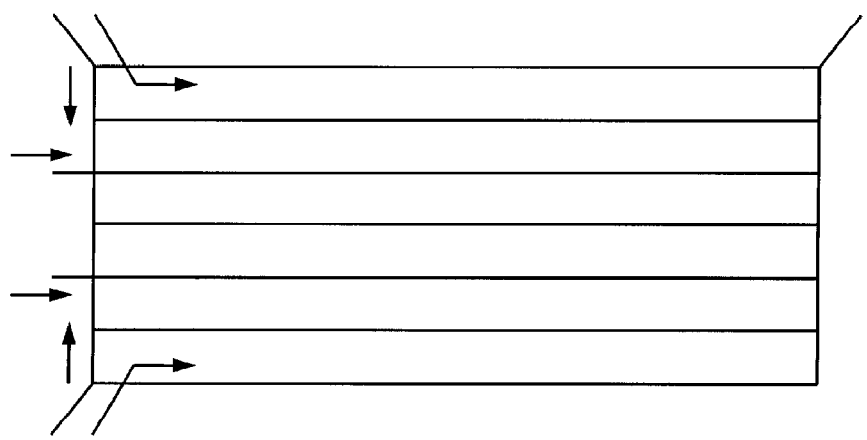
Figure 2 – Prior art

TFT LCD ARRAY SUBSTRATE AND THE MANUFACTURING METHOD THEREOF

FIELD OF THE INVENTION

The present invention relates to a thin film transistor liquid crystal display (TFT LCD), and in particular, to an array substrate of a TFT LCD and the manufacturing method thereof.

BACKGROUND OF THE INVENTION

Among the various flat panel displays, the TFT LCD is dominating the flat panel display market because of lower power consumption, relatively low manufacturing cost, and substantial no radiation. The TFT LCD device is formed by assembling an array substrate and a color filter substrate with a liquid crystal layer interposed therebetween.

FIG. 1A is a top plan view of a single pixel of a conventional amorphous silicon TFT LCD array substrate, and FIGS. 1B and 1C are cross-sectional views taken along the line A-A and line B-B of FIG. 1A, respectively. The array substrate comprises a plurality of gate lines 1 and a plurality of data lines 5 perpendicular to the gate lines 1. The adjacent gate lines and data lines define a plurality of pixel areas. Each pixel area comprises a TFT switching device, a transparent pixel electrode 10, and optionally a common electrode 11. The TFT device is configured as a bottom gate type by a back channel etching as shown in FIG. 1B. The TFT switching device comprises a gate electrode 2, a gate insulating layer 4, a semiconducting active layer 3, a source electrode 6, and a drain electrode 7. A passivation layer 8 is coated over the above-mentioned components, and a passivation layer via hole 9 is formed above the drain electrode 7. The transparent electrode 10 is connected with the drain electrode 7 of the TFT device via the passivation layer via hole 9. The source electrode 6 is connected with one of the data lines 5. A storage capacitor 13 is formed by overlapping the pixel electrode 10 with the gate line 1 and overlapping the pixel electrode 10 with the common electrode 11. In order to lower and reduce the light leakage within pixel after assembling the substrates, light blocking bars 12 are formed on the sides, which are parallel to the data lines, of the pixel electrode 10, which configuration can reduce the light induced current leakage in the channel of the TFT device. The light blocking bars 12 can be made of the same material as the gate electrode 2 in a same mask photolithography) process. The common electrode 11 can also be made of the same material as the gate electrode 2 and is connected with the light blocking bars 12, as shown in FIGS. 1A and 1C.

The five-mask (photolithography) process is a typical manufacturing technology for a TFT LCD array substrate at present and generally comprises the following five steps:

1). forming a gate electrode and gate line, and optionally forming light blocking bars and/or common electrodes simultaneously;

2). forming a gate insulating layer and an active layer;

3). forming a source electrode, a drain electrode, and a data line;

4). forming a passivation layer; and

5). forming a pixel electrode.

Each of the steps comprises three main processes, namely, thin film deposition, forming of the etching mask pattern (coating a photoresist layer, exposing with a mask plate, and developing), and etching. Each of the five steps uses a mask plate to pattern the respective deposited layer. The above process is typical for the 5-Mask technology. Other 5-Mask technologies could also be employed by changing the mask plate design and the process flow.

In the TFT LCD array substrate as shown in FIG. 1A, since the common electrode structure (including the light blocking bars 12 and common electrode 11) is formed in an "H" shape in the central portion of the pixel area, the aperture ratio is decreased. The "H" shape structure also needs new manufacturing process and repairing method. In the conventional TFT LCD array substrate, the capacitance occurring between the common electrode 11 and the data line 5 can also affect the data transmission through the data line 5. A schematic view of the load current for the common electrode of the conventional TFT LCD is shown in FIG. 2, in which the current is mainly concentrated in the horizontal direction, for which the conventional solutions are to improve the peripheral circuit design and improve the way of inputting signals.

SUMMARY OF THE INVENTION

In view of the problems in the related art, the embodiment of present invention is to provide a TFT LCD array substrate with a longitudinal common electrode and the manufacturing method thereof, increasing the density of the common electrode and the aperture ratio of a pixel area.

In one aspect of the present invention, there is provided a TFT LCD array substrate. The TFT LCD array substrate comprises a substrate, a gate line and a data line formed on the substrate and crossing each other so as to define a pixel area, a pixel electrode formed in the pixel area, a TFT formed in the pixel area, a common electrode formed on the substrate and extending parallel to the data line. The TFT comprises a gate electrode connected with the gate line, a first source/drain electrode connected with the data line, and a second source/drain electrode connected with the pixel electrode.

Preferably, the array substrate of TFT LCD according to an embodiment of the present invention further comprises a light blocking bar below an edge of the pixel electrode. The light blocking bar and the common electrode can be connected together as an integrated structure. The light blocking bars extend parallel to the gate line or the data line. Preferably, the light blocking bar comprises a first blocking bar parallel to the gate line and a second blocking bar parallel to the data line. The first blocking bar and the second blocking bar can be connected together to form a closed structure. The closed structure can be connected with the common electrode.

In another aspect of the present invention, there is provided a manufacturing method of a TFT LCD array substrate. The method comprises the steps of forming and patterning a gate metal film on a substrate so as to form a gate line and a gate electrode. A gate insulating layer film and an active film are formed sequentially on the substrate and the active film is patterned so as to form an active layer of the TFT. A source/drain metal film is formed and patterned so as form a data line, a common electrode, first and second source/drain electrodes of the TFT, and a common electrode. The first source/drain electrode and the second source/drain electrode are spaced apart and the first source/drain electrode is connected with the data line. The common electrode is parallel to the data line. Next, a passivation layer is formed and patterned so as to form a passivation layer via hole above the second source/drain electrode. Finally, a pixel electrode film is formed on the passivation layer and patterned so as to form a pixel electrode connected with the second source/drain electrode via the passivation layer via hole.

Preferably, the manufacturing method of a TFT LCD array substrate according to the embodiment of the present invention further comprises the step of forming a light blocking bar below an edge of the pixel electrode to be later formed during formation of the data line and the common electrode. Preferably, the light blocking bar and the common electrode can be connected together as an integrated structure. The light blocking bar may extend parallel to the gate line or the data line. Preferably, the light blocking bar may comprise a first blocking bar parallel to the gate line and a second blocking bar parallel to the data line. The first blocking bar and the second blocking bar can be connected to form a closed structure.

In the embodiments of the present invention, the common electrode is not formed in the central portion of a pixel area, and therefore the aperture ratio is increased significantly. Furthermore, the light blocking bars formed of the same metal material as the data line may be arranged along longitudinal directions to form a closed structure so as to increase the storage capacitance.

Further, in the embodiments of the present invention, the voltage for the common electrode can be provided from the upper and lower ends of the substrate due to the arrangement of the common electrode along the longitudinal direction, therefore when a defect occurs in the common electrode within a pixel, it is only necessary to cut the common electrode transversely without degrading the display quality so as to facilitate the repairing process.

Furthermore, in the embodiments of the present invention, transmission of the common electrode signal changes from a transverse direction to a longitudinal direction. This configuration can increase the density of the common electrodes and the number of the inputting ends, for example, from 1024 to 3840 or more, and also can reduce the signal difference among different positions and maintain a more balanced signal distribution. The ratio of the defective product due to the flickering and bright line is effective lowered and the harm caused by the signal delay is also reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter, and the accompanying drawings, which are given by way of illustration only and thus are not limitative and wherein:

FIG. 1A is a top plan view of a single pixel in a TFT LCD array substrate according to the prior art;

FIG. 1B is a partial cross-sectional view taken along the line A-A in FIG. 1A;

FIG. 1C is a partial cross-sectional view taken along the line B-B in FIG. 1A;

FIG. 2 is a schematic view for the load of the common electrode in a TFT LCD device according to the prior art;

DETAILED DESCRIPTION OF THE PREFERRED EMBODIMENTS

Figure 3A:
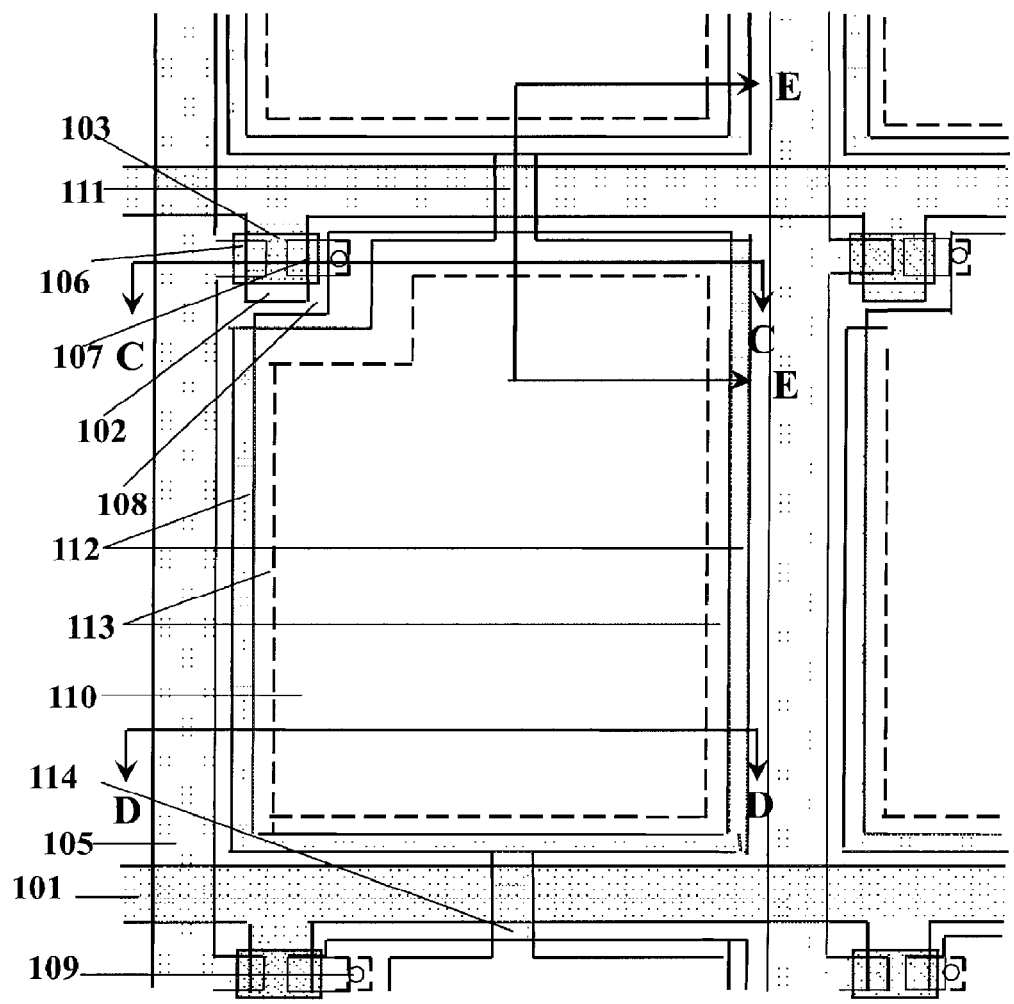
FIG. 3A is a top plan view of a single pixel in a TFT LCD array substrate according to an embodiment of the present invention.

Exemplary embodiments of the present invention will be described hereinafter with reference to the accompanying drawings. It should be understood that in this description when a layer or an element is referred to as being "on" or "connected to" another layer or element, this layer or element can be directly on or directly connected to the other layer or element, or an intervening layer may also be present. In this description, the "longitudinal direction" and "horizontal direction" are relative directions in the drawings, and it should be understood that when the drawings are rotated by 90 degrees, the "longitudinal direction" and "horizontal direction" will be interchanged.

Figure 3B:
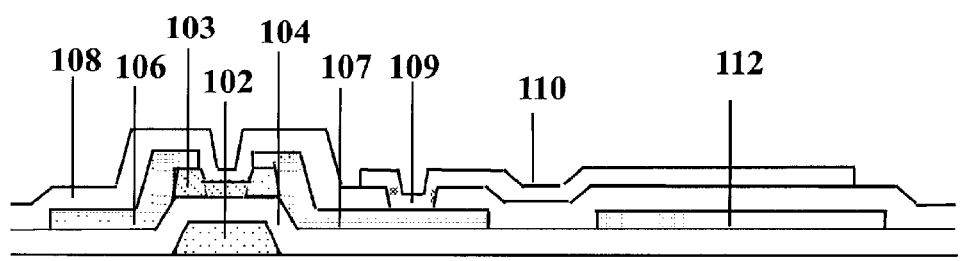
FIG. 3B is a cross-sectional view taken along the line C-C in FIG. 3A.

As shown in FIG. 3A, on the TFT LCD array substrate according to the embodiment of the present invention, a plurality of gate lines 101, horizontal light blocking bars 112 parallel to the gate lines 101, a common electrode 111 perpendicular to the gate lines 101, vertical light blocking bars 112 perpendicular to the gate lines 101, and a plurality of data lines 105 perpendicular to the gate lines 101 are disposed. The adjacent gate lines 101 and the data lines 105 define a plurality of pixel areas. Each pixel area comprises a TFT switching device, a pixel electrode 110, and a common electrode 111. The TFT device is configured as a bottom gate type by a back channel etching as shown in FIG. 3B. The TFT device comprises a gate electrode 102, a gate insulating layer 104, a semiconducting active layer 103, a source electrode 106, and a drain electrode 107, that are sequentially formed on a substrate (not shown) such as a glass substrate. The gate electrode 102 branches out from one corresponding gate electrode 101, or may be part of the gate line 101. The source electrode 106 and the drain electrode 107 are spaced apart and formed on the two ends of the active layer 103, respectively. The portion of the active layer 103 between the source electrode 106 and the drain electrode 107 is the channel of the TFT device. A passivation layer 108 is formed on the above components and covers them. The pixel electrode 110 is formed on the passivation layer 108 and connected with the drain electrode 107 via a passivation layer via hole 109 formed in the passivation layer 108 over the drain electrode 107.

In TFT LCD array substrate according to the embodiment of the present invention, the common electrode 111 is formed of the same conductive material (for example, a metal) as the data line 105 and arranged in a longitudinal direction on the array substrate in FIG. 3A. Furthermore, as shown in FIG. 3A, four light blocking bars 112 (including two horizontal light blocking bars and two vertical light blocking bars) are connected together to constitute a closed light blocking bar structure, which is overlapped with the edges of the pixel electrode 110 and not only blocks the light leakage but also provides a supplemental storage capacitor 113. Such arrangement has the advantages in providing larger storage capacitance and improving the display quality. Meanwhile, compared with the pixel structure in the related art, the aperture ratio is increased significantly due to the elimination of the "H" shape common electrode structure in the central portion of the pixel area.

As shown in FIG. 3A, the common electrode 111 parallel to the data line 105 is formed at the edge of the pixel area according to the embodiment of the present invention, and the common electrode 111 is connected to the light blocking bars 12 that are formed to prevent the light leakage at the edges of the pixel electrode 110. The light blocking bars 12 form a closed structure. The common electrode 111 and the light blocking bars 12 are made of the same conductive materials (for example, a metal) as the data line 105. The common electrodes 111 are interconnected with each other for different pixel areas along the longitudinal direction. The common electrode 111, light blocking bars 112, the data lines 105, and the source/drain electrodes 106, 107 of the TFT device can be formed of the same material in a same photolithography process.

Figure 3C:
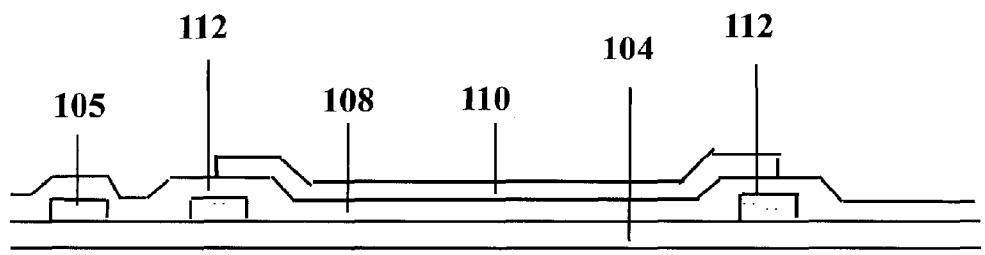
FIG. 3C is a cross-sectional view taken along the line D-D in FIG. 3A.
Figure 3D:
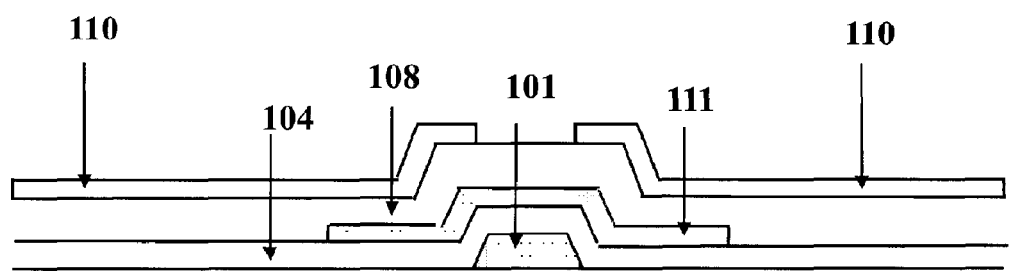
FIG. 3D is a cross-sectional view taken along the line E-E in FIG. 3A.

FIG. 3B to FIG. 3D show cross-sectional views further illustrating the TFT pixel structure according to the embodiment of the present invention. From the comparison between FIG. 3B and FIG. 1B, it is seen that the TFT pixel structure according to the embodiment of the present invention and that of the related art are similar, but in the embodiment of the present invention, the common electrode 111 and light blocking bars 112 are formed of the same conductive material as the data line at the edges of the pixel electrode and connected with each other. The light blocking bars 112 shown in the cross-sectional view of FIG. 3C are different form those in TFT device in the related art as shown in FIG. 1C in that the light blocking bars 112 are formed of the same conductive material as the data line and also may be formed in a closed structure. The above structure can obtain larger storage capacitance and improve the aperture ratio of the pixel area.

Furthermore, the longitudinal arrangement of the common electrode according to the embodiment of the present invention is advantageous for repairing. The common electrodes 111 for each pixel area are connected with each other in the longitudinal direction, and the voltage for the common electrode can be applied at the upper and lower ends of the array substrate. Therefore, when a defect occurs at the common electrode 111 within a pixel area, it is only required that a transverse cutting operation is performed, for example, at a repairing point 114 without degrading the display quality. The repairing point 114 is located at the common electrode 111 between adjacent pixel areas, for example, as shown in FIG. 3A.

Figure 4:
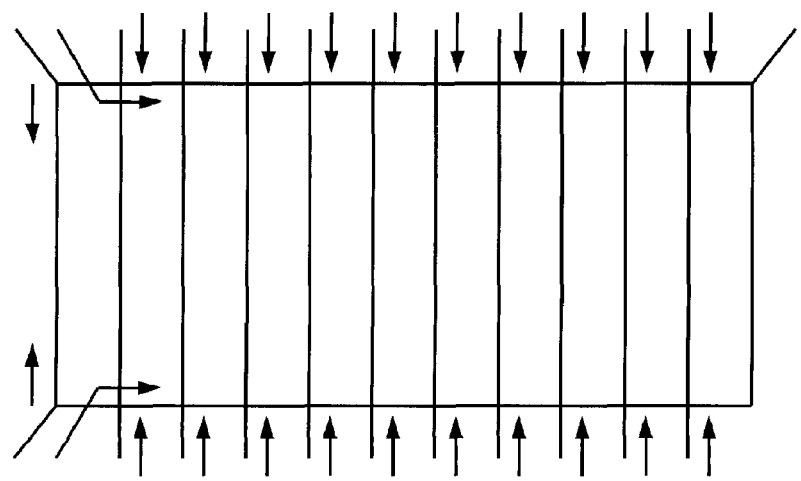
FIG. 4 is a schematic view for the load of the common electrode in a TFT LCD device according to the embodiment of the present invention.

FIG. 4 shows the schematic view of the current load of the common electrode in the TFT LCD array substrate according to the embodiment of the present invention. Compared with the load of the common electrode of the related art shown in FIG. 2, the current and the potential among the common electrodes are well balanced with formation of a matrix load pattern by arranging the common electrodes longitudinally in the embodiment of the present invention. Also compared with the TFT LCD array substrate in the related art, the transmission of the common electrode signal is changed from the transverse direction to the longitudinal direction, and the number of the inputting ends is increased, for example, from 1024 to 3840 or more. Therefore, the density of the signal lines is increased, the signal difference among different locations is reduced, and a more balanced signal distribution can be maintained. Also, the ratio of the defective products due to flickering and bright line is reduced effectively and the harm caused by the signal delay is decreased.

Furthermore, in the above embodiment, the gate line 101, the data line 105, the source electrode 106 and the drain electrode 107 of the TFT device, the common electrode 111, and the light blocking bars 112 can be formed of one material selected from the group consisting of aluminum (Al), chromium (Cr), tungsten (W), tantalum (Ta), titanium (Ti), molybdenum (Mo), aluminum-nickel (Al—Ni) and the combination thereof, in a layered structure, such as a single layer structure or a multi-layer structure. The gate line 101, the common electrode 111, and the light blocking bars 112 can be formed of the same material in a same process of film deposition, photolithography, and etching. The gate insulating layer 104 can be formed of silicon nitride or aluminum oxide etc. The pixel electrode 110 can be formed of a transparent conductive material such as indium tin oxide (ITO), indium zinc oxide (IZO), or aluminum zinc oxide (AZO), or be formed of a metal such as aluminum in the case of reflective type TFT LCD. The semiconducting active layer 3 can be formed of a semiconducting material such as amorphous silicon or polysilicon.

Although the drain electrode of the TFT is described as being connected to the pixel electrode in the above embodiment, it should be appreciated by those skilled in the art that the source electrode and the drain electrode in the TFT are interchangeable, that is, the drain electrode can be connected to the data line while the source electrode is connected to the pixel electrode. Moreover, the source and drain electrodes can be collectively referred to as source/drain electrodes.

In the above description, the bottom gate TFT is described as an example of a switching device for the pixel area, however it should be understood by those skilled in the art that the present invention can also be applied to the case where the switching element of the pixel is a top gate TFT, as long as a common electrode is formed parallel to the data line in the pixel area. Preferably, the light blocking bars are formed below the edges of the pixel electrode, and more preferably formed in connection with the common electrode as an integrated structure. More preferably, the light blocking bars can be connected to each other to form an integrated structure, for example, a closed structure.

The configuration and manufacturing method of the top gate TFT are well known to those skilled in the art. For example, a conventional method for forming a pixel with a top gate TFT may comprise the steps of forming an active layer on a substrate, forming a gate insulating layer on the active layer, forming a gate electrode and a gate line on the gate insulating layer, forming a second insulating layer over the gate electrode and the gate line, forming data line, a source electrode and a drain electrode on the second insulating layer that are spaced apart from each other and connected with the active layer through via holes, forming a passivation layer on the source and drain electrodes, and forming a pixel electrode on the passivation layer that is connected with the drain electrode through a via hole, the detailed description of which is not given herein for simplicity. Also, in the pixel area with the top gate TFT, according to an embodiment of the present invention, a via hole, through which the drain electrode and the pixel electrode are connected, can be formed over the common electrode in the passivation layer. The common electrode can be formed in formation of the date lines and parallel with the date line in the embodiment of the present invention.

The above pixel structure is only one exemplary structure of the present embodiment. It is apparent that various modification in form and configuration can be made, such as only connecting the light blocking bars parallel to the data lines with the common electrode, or only connecting the light blocking bars parallel to the gate lines with the common electrode, or only connecting the light blocking bars parallel to the gate lines and the light blocking bars parallel to the data lines, as long as the common electrode is arranged longitudinally parallel with the date lines. These pixel structures in other shape and pattern are also within the spirit and scope of the present invention. In addition, the gate electrode of the TFT device can be a part of the body of the gate line rather than a part that is branched out from the gate line, but in both case the gate electrode can be regarded as being connected with the gate line.

The above TFT LCD array substrate according to the present embodiment can be manufactured by the following exemplary method.

First, a gate metal film is formed, for example, on a glass substrate in a thickness between 1000 Å and 7000 Å by a deposition method such as a magnetron sputtering method. The gate metal film is typically made of a material such as molybdenum, aluminum, aluminum nickel alloy, molybdenum tungsten alloy, chromium, copper or the combination thereof. Then a plurality of gate lines 101 and the gate electrodes projected from the gate lines 101 are formed on a specified area of the glass substrate by the exposure process and etching process using a gate mask plate.

Thereafter, a gate insulating layer in a thickness between 1000 Å and 6000 Å and an amorphous silicon film in a thickness between 1000 Å and 6000 Å are successively formed on the array substrate by a chemical vapor deposition (CVD) method, for example. The material of the gate insulating layer is typically silicon nitride, silicon oxide, or silicon oxynitride. The amorphous silicon film is etched after the exposure and development with a mask plate for the active layer so as to from the active layer 103 in the form of a silicon island. The gate insulating layer between the gate metal film and the amorphous silicon film serves as an etching stop when patterning the amorphous silicon film. The active layer 103 can also be formed of a semiconducting material such as polysilicon, which can be crystallized from the amorphous silicon film after deposition with a rapid thermal anneal (RTA) or a laser anneal, for example.

Next, similar to the formation of the gate line and gate electrode, a source/drain metal film in a thickness between 1000 Å and 7000 Å is deposited on the array substrate by a deposition method, and a plurality of data lines 105, source electrodes 106, drain electrodes 107, common electrodes 111, and the light blocking bars 112 are formed on a specific area by patterning with a mask plate for the source/drain electrode. The data lines 105, the source electrodes 106, the drain electrodes 107, the common electrodes 111, and the light blocking bars 112 have the same thickness and the slope angle after etching. The source electrode 106 and the drain electrode 107 are connected with respective ends of the active layer 103, respectively, with a channel exposed therebetween. The common electrodes 111 is parallel to the date line 105, and the light blocking bars 112 are formed below the edges of the pixel electrode to formed below.

Next, a passivation layer in a thickness between 1000 Å and 6000 Å is deposited on the array substrate, similar to the formation of the gate insulating layer and the active layer. The material of the passivation layer can be silicon nitride, silicon oxide, or silicon oxynitride. At this time, the gate lines 101 and the gate electrode 102 are covered by the gate insulating layer 104 and the passivation layer 108, while the data lines 105, the common electrode 111, the light blocking bars 112, and the gate lines 101 are covered by the passivation layer 108 with a same thickness. A passivation layer via hole 109 over the drain electrode 107 is formed by the exposure and etching process with a mask plate for the passivation layer.

Finally, a pixel electrode film is deposited on the glass substrate, similar to the formation of the gate insulating layer and the active layer. The pixel electrode 110 is formed by the patterning, etching process, etc. with a mask plate for the pixel electrode. Also, a storage capacitor 113 can be formed by overlapping the pixel electrode 10 with the light blocking bars 12. The materials for the transparent pixel electrode may be indium tin oxide, indium zinc oxide, or aluminum zinc oxide in a thickness between 100 Å and 1000 Å.

The above embodiment is only one implementation of the present invention. The other implementation is also possible by increasing or decreasing the number of the exposure process or by selecting different materials or the combination of the materials. Furthermore, it is apparent that various modification and changes can be made to the structure of the TFT LCD array substrate, in terms of the closed structure of the light blocking bars and the connection of the light blocking bars and the common electrode in a longitudinal arrangement.

Although the present invention has been described in detail referring to the preferred embodiments, the above embodiments are used only for illustration and not for the purpose of limitation. Accordingly, it will be understood by those of ordinary skill in the art that it is possible to use other materials and equipments if necessary, and that various modifications or equivalent alterations may be made to the embodiments of the present invention without departing from the spirit and scope of the present invention as set forth in the following claims.

What is claimed is:

1. A thin film transistor liquid crystal display (TFT LCD) array substrate, comprising:
    a substrate;
    a gate line and a data line formed on the substrate and crossing each other so as to define a pixel area;
    a pixel electrode formed in the pixel area;
    a thin film transistor (TFT) formed in the pixel area and comprising a gate electrode connected with the gate line, a first source/drain electrode connected with the data line, and a second source/drain electrode connected with the pixel electrode;
    a light blocking bar formed below an edge of the pixel electrode; and
    a common electrode formed on the substrate and extending parallel to the data line, wherein the light blocking bar and the common electrode are connected together as an integrated structure, and the common electrode intersects with the gate line, and
    wherein the common electrode connects the light blocking bars in two adjacent pixel areas.

2. The array substrate of claim 1, wherein the gate line, the data line, the first and second source/drain electrode of the thin film transistor, the common electrode and the light blocking bars are formed of a material selected from the group consisting of aluminum, chromium, tungsten, tantalum, titanium, molybdenum, aluminum-nickel and the combinations thereof in a structure selected from the group consisting of a single layer structure and a multi-layer structure.

3. The array substrate of claim 1, wherein the data line, the common electrode, and the light blocking bar are formed of a same material in a same process.

4. The array substrate of claim 1, wherein the light blocking bar comprises a first light blocking sub-bar extending parallel to the gate line and a second light blocking sub-bar extending parallel to the data line.

5. The array substrate of claim 4, wherein the first blocking sub-bar and the second blocking sub-bar are connected together to form a closed structure.

6. The array substrate of claim 1, wherein the pixel electrode are formed of a material selected from the group consisting of indium tin oxide, indium zinc oxide, and aluminum zinc oxide.

7. A method of manufacturing a TFT LCD array substrate, comprising the steps of:
    forming and patterning a gate metal film on a substrate so as to form a gate line and a gate electrode of a TFT;

forming a gate insulating layer and an active film sequentially and patterning the active film so as to form an active layer of the TFT;

forming and patterning a source/drain metal film so as to form a data line that crosses the gate line to define a pixel area, a light blocking bar, a common electrode, first and second source/drain electrodes of the TFT, wherein the first source/drain electrode and the second source/drain electrode are spaced apart, the first source/drain electrode is connected with the data line, the common electrode is parallel to the data line, the light blocking bar is formed below an edge of the pixel electrode, the light blocking bar and the common electrode are connected together as an integrated structure, and the common electrode intersects with the gate line and connects the light blocking bar in the pixel area with a light blocking bar in an adjacent pixel area;

forming and patterning a passivation layer so as to formed a via hole in the passivation layer above the second source/drain electrode; and forming and patterning a pixel electrode film on the passivation layer so as to form a pixel electrode connected with the second source/drain electrode via the via hole.

8. The method of claim 7, wherein the light blocking bar comprises a first light blocking sub-bar extending parallel to the gate line and a second light blocking sub-bar extending parallel to the data line.

9. The method of claim 8, wherein the first blocking sub-bar and the second blocking sub-bar are connected to form a closed structure.

10. The method of claim 7, wherein the gate line, the data line, the first and second source/drain electrode of the thin film transistor, the common electrode and the light blocking bars are formed of a material selected from the group consisting of aluminum, chromium, tungsten, tantalum, titanium, molybdenum, aluminum-nickel and the combinations thereof in a structure selected from the group consisting of a single layer structure and a multi-layer structure.

11. The method of claim 7, wherein the pixel electrode film are formed of a material selected from the group consisting of indium tin oxide, indium zinc oxide, and aluminum zinc oxide.

12. The method of claim 7, wherein the gate insulation layer the passivation layer are formed of a material from the group consisting of silicon nitride, silicon oxide, silicon oxynitride, and aluminium oxide.

* * * * *